(12) United States Patent
Park et al.

(10) Patent No.: US 11,177,553 B2
(45) Date of Patent: Nov. 16, 2021

(54) INTERFACE CONNECTOR FOR SUPPORTING MILLIMETER WAVE WIRELESS COMMUNICATIONS

(71) Applicant: QUALCOMM Incorporated, San Diego, CA (US)

(72) Inventors: Sang-June Park, San Diego, CA (US); Peter Han Lien, Carlsbad, CA (US); Eric Lunzer, San Diego, CA (US); Timothy Vu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/863,874

(22) Filed: Apr. 30, 2020

(65) Prior Publication Data

US 2020/0350658 A1 Nov. 5, 2020

Related U.S. Application Data

(60) Provisional application No. 62/843,215, filed on May 3, 2019.

(51) Int. Cl.
| | | |
|---|---|---|
| *H01Q 1/24* | (2006.01) | |
| *H01Q 1/22* | (2006.01) | |
| *H01Q 23/00* | (2006.01) | |
| *H04B 1/40* | (2015.01) | |
| *H01Q 1/50* | (2006.01) | |

(52) U.S. Cl.
CPC ............. *H01Q 1/2283* (2013.01); *H01Q 1/50* (2013.01); *H01Q 23/00* (2013.01); *H04B 1/40* (2013.01)

(58) Field of Classification Search
CPC ...... G06F 16/288; G06F 40/186; G06F 15/76; G06F 21/552; G06F 16/254; G06F 21/6245; H04W 12/02; H04L 67/306; H04L 63/20; H04L 63/101; H04L 63/04; G06Q 10/06; G06N 20/00
USPC .......................................................... 343/702
See application file for complete search history.

(56) References Cited

U.S. PATENT DOCUMENTS

| | | | |
|---|---|---|---|
| 5,967,831 A | 10/1999 | Yamada et al. | |
| 6,749,468 B2 | 6/2004 | Avery | |
| 7,288,727 B1 | 10/2007 | Garcia | |
| 7,811,100 B2 | 10/2010 | Stoner | |
| 9,219,324 B2* | 12/2015 | Wittmann | H01R 13/516 |
| 9,939,850 B2* | 4/2018 | Hoellwarth | G06F 1/1626 |
| 9,962,038 B2* | 5/2018 | Veltrop | G05B 15/02 |
| 10,154,757 B2* | 12/2018 | Veltrop | A47J 39/006 |
| 10,271,689 B2* | 4/2019 | Veltrop | A47J 39/006 |
| 10,455,983 B2* | 10/2019 | Veltrop | A47J 39/006 |
| 2003/0236031 A1 | 12/2003 | Perugini et al. | |

(Continued)

OTHER PUBLICATIONS

International Search Report and Written Opinion—PCT/US2020/031186—ISA/EPO—dated Sep. 3, 2020.

*Primary Examiner* — Jean B Jeanglaude
(74) *Attorney, Agent, or Firm* — Arent Fox, LLP

(57) ABSTRACT

Aspects described herein relate to at least a portion of a connector configured to support wireless communications that includes multiple chambers, each at least partially enclosed by a continuous isolation structure to provide electrical signal isolation and defining an inner surface. At least one terminal in a first chamber of the multiple chambers is configured for a first interface, and at least one terminal in a second chamber of the multiple chambers is configured for a second interface.

24 Claims, 10 Drawing Sheets

(56) References Cited

U.S. PATENT DOCUMENTS

| | | | |
|---|---|---|---|
| 2013/0136289 A1* | 5/2013 | Goel | H04M 1/03 |
| | | | 381/334 |
| 2014/0177180 A1 | 6/2014 | Malek et al. | |
| 2014/0180866 A1* | 6/2014 | Gonzales | A43D 3/04 |
| | | | 705/26.7 |
| 2017/0025749 A1 | 1/2017 | Frye et al. | |
| 2017/0105313 A1* | 4/2017 | Shedd | H05K 7/20309 |
| 2018/0131054 A1* | 5/2018 | Waid | H01M 10/486 |

* cited by examiner

INTERFACE CONNECTOR FOR SUPPORTING MILLIMETER WAVE WIRELESS COMMUNICATIONS

CLAIM OF PRIORITY UNDER 35 U.S.C. § 119

The present Application for Patent claims priority to Provisional Application No. 62/843,215, entitled "INTERFACE CONNECTOR FOR SUPPORTING MILLIMETER WAVE WIRELESS COMMUNICATIONS" filed May 3, 2019, which is assigned to the assignee hereof and hereby expressly incorporated by reference herein for all purposes.

BACKGROUND

Aspects of the present disclosure relate generally to wireless communication systems, and more particularly, to interface connectors for supporting wireless communications.

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. For example, a fifth generation (5G) wireless communications technology (which can be referred to as 5G new radio (5G NR)) is envisaged to expand and support diverse usage scenarios and applications with respect to current mobile network generations. In an aspect, 5G communications technology can include: enhanced mobile broadband addressing human-centric use cases for access to multimedia content, services and data; ultra-reliable-low latency communications (URLLC) with certain specifications for latency and reliability; and massive machine type communications, which can allow a very large number of connected devices and transmission of a relatively low volume of non-delay-sensitive information.

In some wireless communication technologies, such as 5G, millimeter wave (mmW) spectrum may be used to facilitate wireless communications between nodes. Currently, devices use board-to-board (B2B) connectors to connect printed circuit board (PCB) portions of the RF front end. These B2B connectors are designed for direct current (DC) and digital signal connection. Due to power/frequency requirements of mmW spectrum communications, using existing B2B connectors may result in leakage at various portions of a device associated with its radio frequency (RF) front end based on the design of the existing B2B connectors. This may also result in interference to signals being received and/or transmitted by the device (e.g., to sub-6 gigahertz long term evolution (LTE) or global positioning system (GPS) radios in the device).

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

According to an example, a plug configured to support wireless communications is provided that includes multiple chambers, wherein each chamber of the multiple chambers is at least partially enclosed by a continuous isolation structure and defines an inner surface, and at least one terminal within the inner surface of each of the multiple chambers, wherein at least a first terminal in a first chamber of the multiple chambers is configured for a first interface, and wherein at least a second terminal in a second chamber of the multiple chambers is configured for a second interface. Providing the multiple separate chambers can allow for providing isolation for the chambers to mitigate energy leakage (and thus interference) from associated interfaces from occurring among the chambers and/or outside of a connector that includes the plug coupled to a receptacle. This can improve the signal quality for the terminals and/or for electronics nearby the connector within a device.

In a further example, a method for manufacturing a printed circuit configured to support wireless communications is provided. The method includes forming at least a portion of a connector having multiple chambers and at least one terminal within each of the multiple chambers, wherein each chamber is at least partially enclosed by a continuous isolation structure, coupling at least a first terminal in a first chamber of the multiple chambers to a first line on the printed circuit for a first interface, and coupling at least a second terminal in a second chamber of the multiple chambers to a second line on the printed circuit for a second interface. Providing the multiple separate chambers can allow for providing isolation for the chambers to mitigate energy leakage (and thus interference) from associated interfaces from occurring among the chambers and/or outside of the connector. This can improve the signal quality for the terminals and/or for electronics nearby the connector within a device.

In another example, a receptacle configured to support wireless communications is provided. The receptacle includes at least two terminals configured for a first interface and a second interface, and an isolation portion at least partially enclosing each of the at least two terminals in respective chambers, wherein the isolation portion forms part of a continuous isolation structure, at least when coupled with a plug having at least two different terminals that couple to the at least two terminals. Providing the multiple separate chambers can allow for providing isolation for the chambers to mitigate energy leakage (and thus interference) from associated interfaces from occurring among the chambers and/or outside of a connector that includes a plug coupled to the receptacle. This can improve the signal quality for the terminals and/or for electronics nearby the connector within a device.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
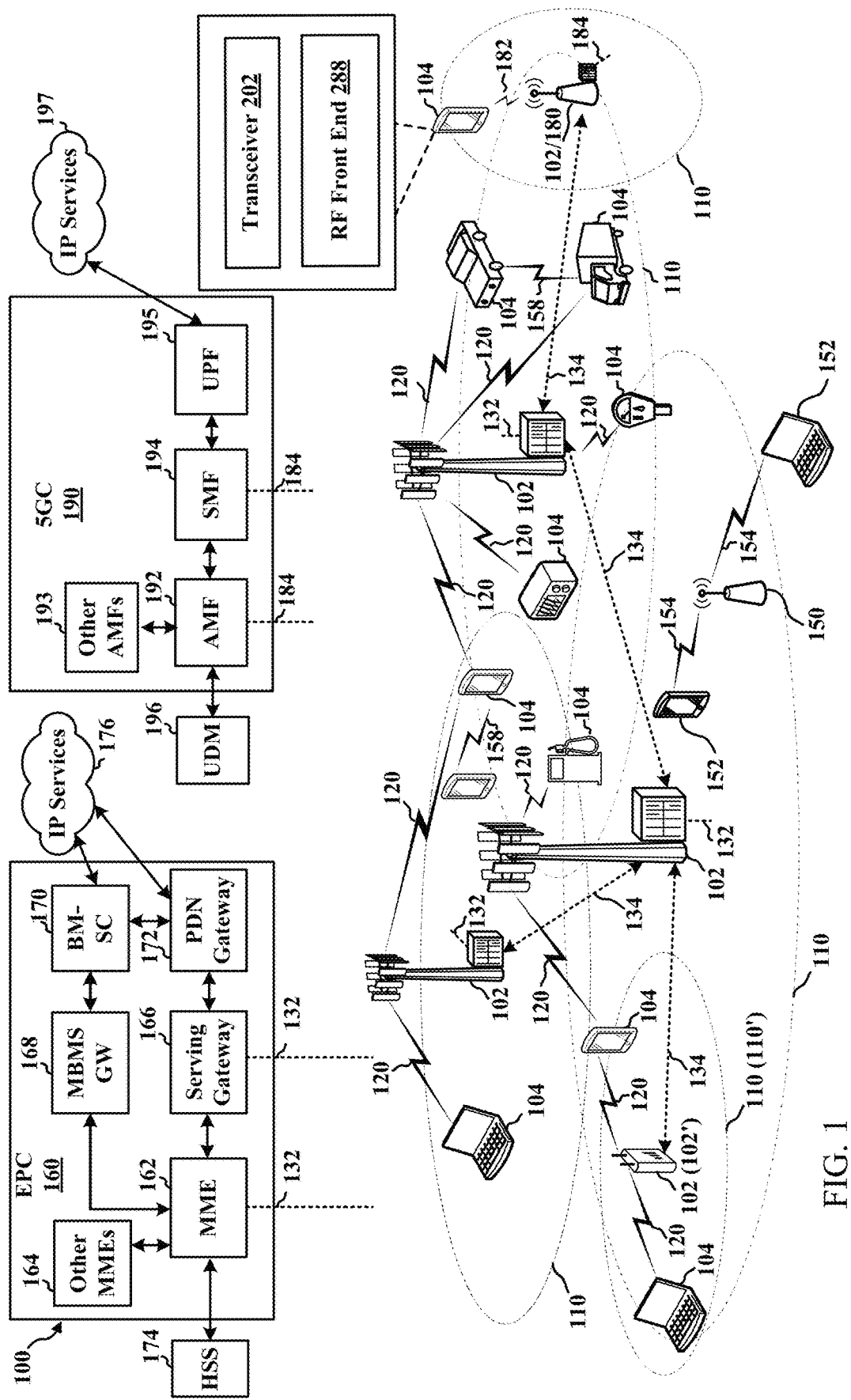
FIG. 1 illustrates an example of a wireless communication system, in accordance with various aspects of the present disclosure.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

The described features generally relate to an improved connector design for board-to-board (B2B) components of a wireless communication device to minimize radio frequency (RF) leakage. The connector may include one or more of a plug for a flexible printed circuit (FPC) or a corresponding receptacle on a printed circuit board (PCB) that can receive the plug to connect multiple PCBs via the FPC. For example, the connector may be completely (or at least substantially) shielded by a continuous isolation structure. For example, the continuous isolation structure may include a continuous ground reference. This may provide a minimal mode mismatch between FPC and PCB mode. Also, the connector may allow for a FPC design that may have a less fringing field with FPC interface routing mismatch than conventional connectors/FPCs. In one example, the connector may include multiple chambers that each enclose one or more terminals, where each of the multiple chambers can include a continuous isolation structure around the one or more terminals. This continuous isolation structure may mitigate RF leakage from the corresponding terminals and may allow for providing an electromagnetic interference (EMI)-compliant RF connector. For example, the continuous isolation structure can be connected to a ground reference to provide a continuous ground structure to isolate the electrical energy, as described herein.

In a specific example, the connector may include a first chamber at least partially enclosing a first intermediate frequency (IF) terminal, a second chamber at least partially enclosing a second IF terminal, and a third chamber at least partially enclosing other terminals. The other terminals in the third chamber may include control terminals, such as a battery terminal, voltage terminal, digital terminal, etc. In this regard, the terminals can be disposed, positioned, installed, within, or may otherwise reside within or be at least partially surrounded or enclosed by, the respective chambers. The chambers can be provided with a shielding material, such as plastic, and/or may be at least partially surrounded with the continuous isolation between the terminals. In addition, the continuous isolation structure can be additionally or continuously provided along an exterior of the connector (e.g., an exterior side of the chambers or surrounding the chambers). This structure can facilitate isolation between the terminals themselves and outside of the connector to mitigate RF leakage interference. In a specific example, the connector can be used to connect a baseband and IF part of a device and/or to connect and mmW antenna PCB and a mmW chip, etc.

The described features will be presented in more detail below with reference to FIGS. 1-10.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets, such as data from one component interacting with another component in a local system, distributed system, and/or across a network such as the Internet with other systems by way of the signal.

Techniques described herein may be used for various wireless communication systems such as CDMA, TDMA, FDMA, OFDMA, SC-FDMA, and other systems. The terms "system" and "network" may often be used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description below, however, describes an LTE/LTE-A system for purposes of example, and LTE terminology is used in much of the description below, although the techniques are applicable beyond LTE/LTE-A applications (e.g., to fifth generation (5G) new radio (NR) networks or other next generation communication systems).

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Various aspects or features will be presented in terms of systems that can include a number of devices, components, modules, and the like. It is to be understood and appreciated that the various systems can include additional devices, components, modules, etc. and/or may not include all of the devices, components, modules etc. discussed in connection with the figures. A combination of these approaches can also be used.

FIG. 1 is a diagram illustrating an example of a wireless communications system and an access network 100. The wireless communications system (also referred to as a wireless wide area network (WWAN)) can include base stations 102, UEs 104, an Evolved Packet Core (EPC) 160, and/or a 5G Core (5GC) 190. The base stations 102 may include macro cells (high power cellular base station) and/or small cells (low power cellular base station). The macro cells can include base stations. The small cells can include femtocells, picocells, and microcells. In an example, the base stations 102 may also include gNBs 180, as described further herein. In one example, some nodes of the wireless communication system may have a transceiver 202 and RF front end 288 for transmitting signals to other nodes. UE 104 is shown as having the transceiver 202 and RF front end 288, but other nodes may have such components as well, such as base stations 102. In an example, the RF front end 288 may include one or more PCBs connected via FPC that uses a connector (e.g., combination plug and receptacle) described herein to mitigate RF leakage.

The base stations 102 configured for 4G LTE (which can collectively be referred to as Evolved Universal Mobile Telecommunications System (UMTS) Terrestrial Radio Access Network (E-UTRAN)) may interface with the EPC 160 through backhaul links 132 (e.g., using an S1 interface). The base stations 102 configured for 5G NR (which can collectively be referred to as Next Generation RAN (NG-RAN)) may interface with 5GC 190 through backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or 5GC 190) with each other over backhaul links 134 (e.g., using an X2 interface). The backhaul links 134 may be wired or wireless.

The base stations 102 may wirelessly communicate with one or more UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be referred to as a heterogeneous network. A heterogeneous network may also include Home Evolved Node Bs (eNBs) (HeNBs), which may provide service to a restricted group, which can be referred to as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (e.g., for x component carriers) used for transmission in the DL and/or the UL direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

In another example, certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

A base station 102, whether a small cell 102' or a large cell (e.g., macro base station), may include an eNB, gNodeB (gNB), or other type of base station. Some base stations, such as gNB 180 may operate in a traditional sub 6 GHz spectrum, in millimeter wave (mmW) frequencies, and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 182 with the UE 104 to compensate for the extremely high path loss and short range. A base station 102 referred to herein can include a gNB 180.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The 5GC 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 can be a control node that processes the signaling between the UEs 104 and the 5GC 190. Generally, the AMF 192 can provide QoS flow and session management. User Internet protocol (IP) packets (e.g., from one or more UEs 104) can be transferred through the UPF 195. The UPF 195 can provide UE IP address allocation for one or more UEs, as well as other functions. The UPF 195 is connected to the IP Services 197. The IP Services 197 may include the Internet, an intranet, an IP Multimedia Subsystem (IMS), a PS Streaming Service, and/or other IP services.

The base station may also be referred to as a gNB, Node B, evolved Node B (eNB), an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or 5GC 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

In an example, using an RF front end 288 that employs the connector described herein can allow for mitigating RF leakage in mmW communications.

Figure 7:
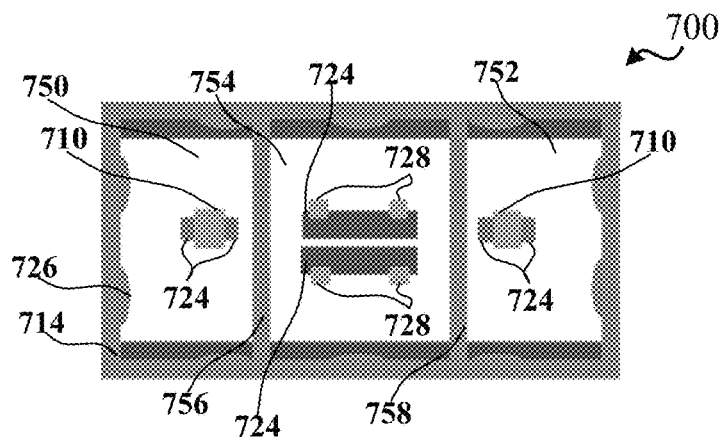
FIG. 7 is a block diagram illustrating another example of a receptacle and plug structure, in accordance with various aspects of the present disclosure.
Figure 7:
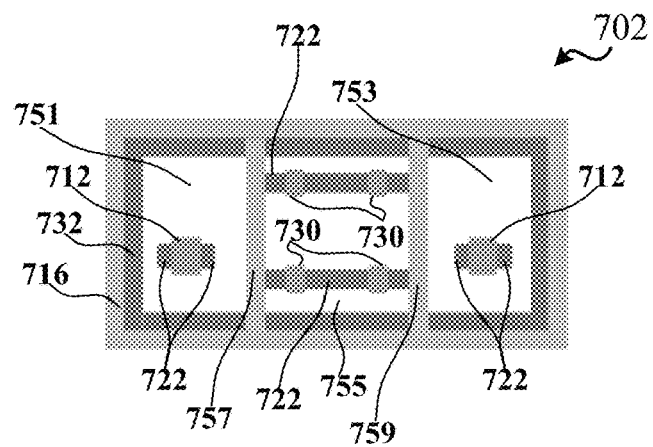
Figure 7:
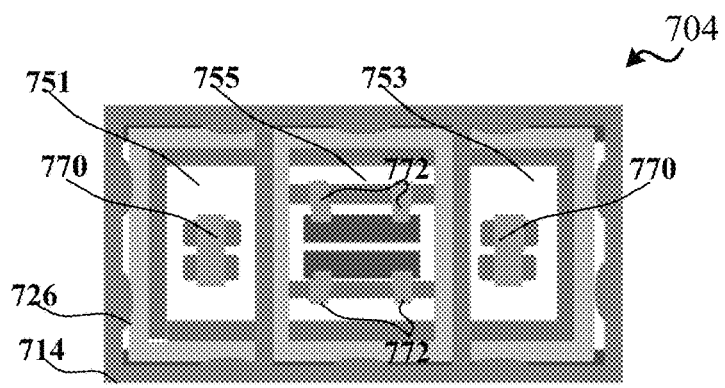
Figure 8:
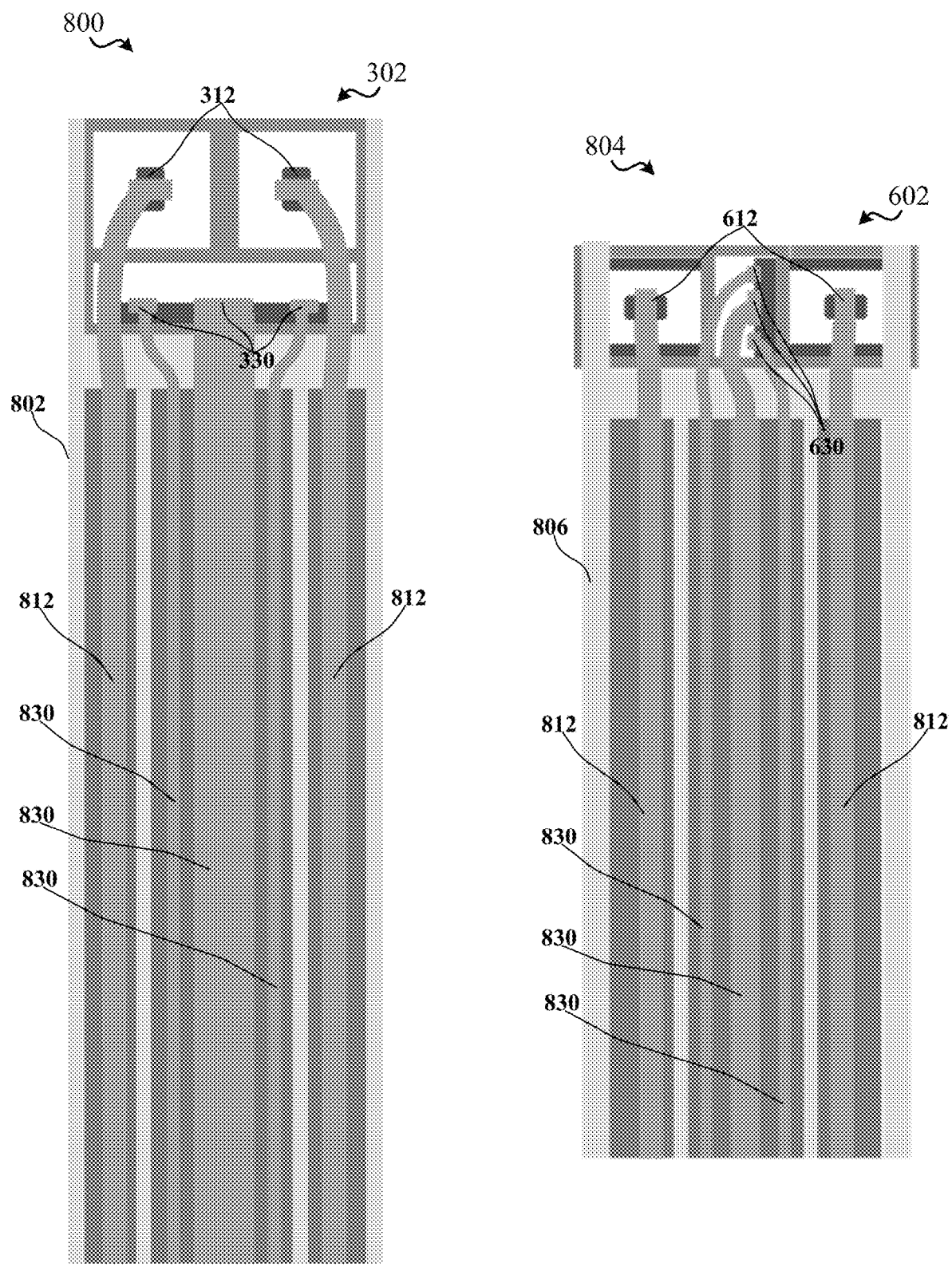
FIG. 8 is a block diagram illustrating an example of a flexible printed circuit, in accordance with various aspects of the present disclosure.
Figure 9:
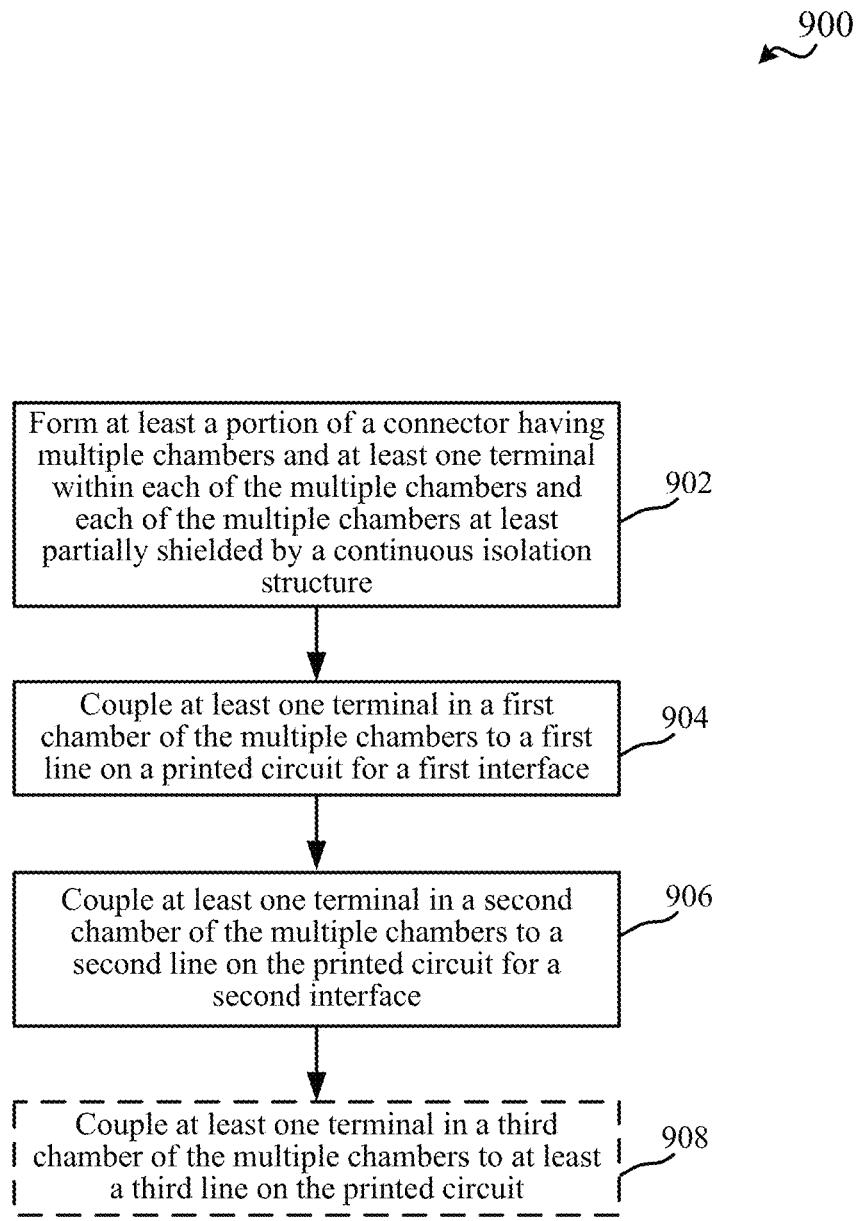
FIG. 9 is a flow chart illustrating an example of a method for manufacturing a printed circuit, in accordance with various aspects of the present disclosure.

Turning now to FIGS. 2-10, aspects are depicted with reference to one or more components and one or more methods that may perform the actions or operations described herein, where aspects in dashed line may be optional. Although the operations described below in FIG. 9 are presented in a particular order and/or as being performed by an example component, it should be understood that the ordering of the actions and the components performing the actions may be varied, depending on the implementation. Moreover, it should be understood that the following actions, functions, and/or described components may be performed by a specially-programmed processor, a processor executing specially-programmed software or computer-readable media, or by any other combination of a hardware component and/or a software component capable of performing the described actions or functions.

Figure 2:
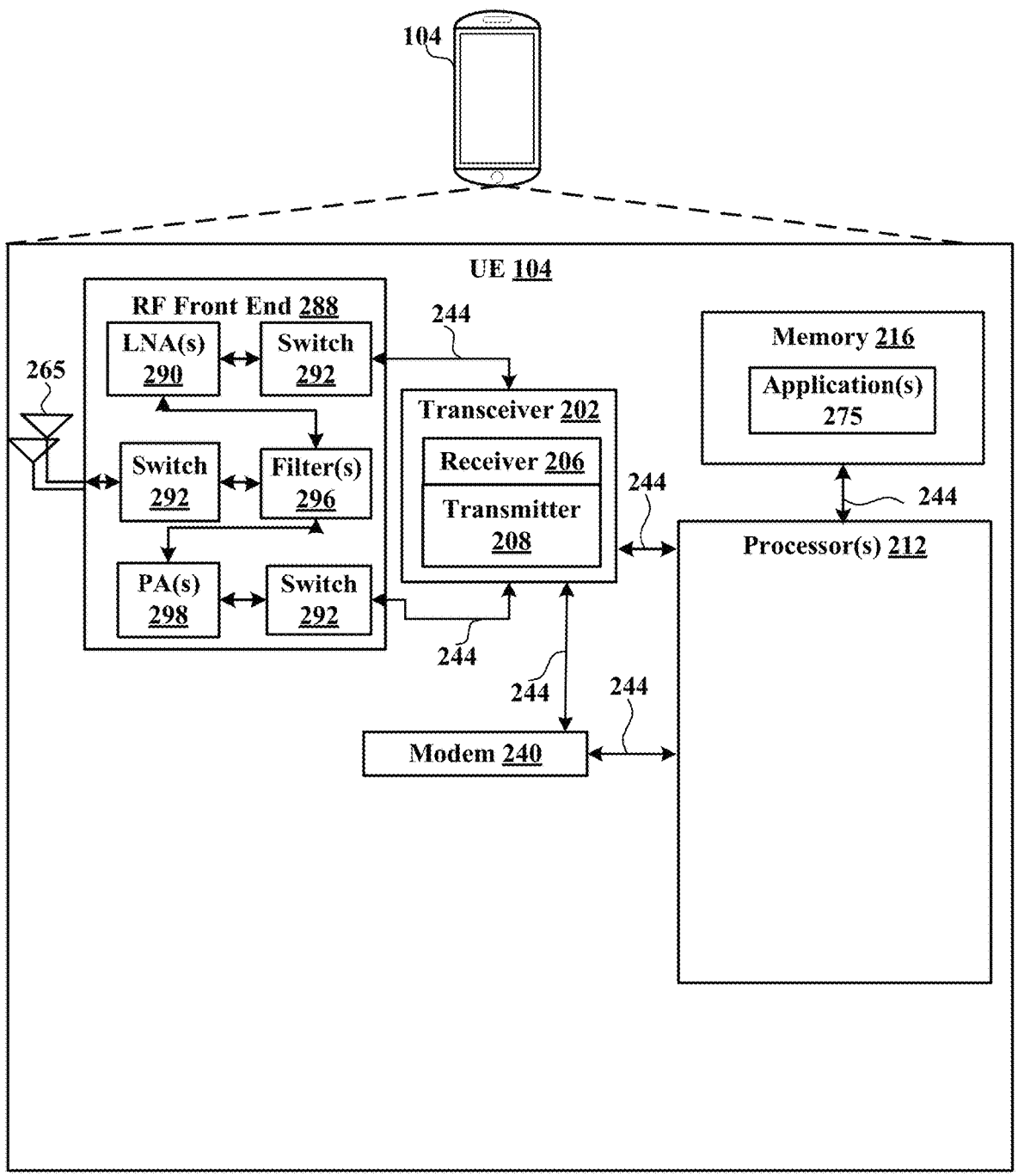
FIG. 2 is a block diagram illustrating an example of a UE, in accordance with various aspects of the present disclosure.

Referring to FIG. 2, one example of an implementation of UE 104 may include a variety of components, some of which have already been described above and are described further herein, including components such as one or more processors 212 and memory 216 and transceiver 202 in communication via one or more buses 244, which may operate in conjunction with modem 240 for communicating signals in a wireless network.

In an aspect, the one or more processors 212 can include a modem 240 and/or can be part of the modem 240 that uses one or more modem processors. Thus, the various functions related to communicating may be included in modem 240 and/or processors 212 and, in an aspect, can be executed by a single processor, while in other aspects, different ones of the functions may be executed by a combination of two or more different processors. For example, in an aspect, the one or more processors 212 may include any one or any combination of a modem processor, or a baseband processor, or a digital signal processor, or a transmit processor, or a receiver processor, or a transceiver processor associated with transceiver 202. In other aspects, some of the features of the one or more processors 212 and/or modem 240 associated with communicating may be performed by transceiver 202.

Also, memory 216 may be configured to store data used herein and/or local versions of applications 275 being executed by at least one processor 212. Memory 216 can include any type of computer-readable medium usable by a computer or at least one processor 212, such as random access memory (RAM), read only memory (ROM), tapes, magnetic discs, optical discs, volatile memory, non-volatile memory, and any combination thereof. In an aspect, for example, memory 216 may be a non-transitory computer-readable storage medium that stores one or more computer-executable codes, and/or data associated therewith, when UE 104 is operating at least one processor 212 to execute applications 275 or various instructions related to communicating with a base station 102 and/or other UEs 104 or other devices.

Transceiver 202 may include at least one receiver 206 and at least one transmitter 208. Receiver 206 may include hardware, firmware, and/or software code executable by a processor for receiving data, the code comprising instructions and being stored in a memory (e.g., computer-readable medium). Receiver 206 may be, for example, a radio frequency (RF) receiver. In an aspect, receiver 206 may receive signals transmitted by at least one base station 102. Additionally, receiver 206 may process such received signals, and also may obtain measurements of the signals, such as, but not limited to, Ec/Io, signal-to-noise ratio (SNR), reference signal received power (RSRP), received signal strength indicator (RSSI), etc. Transmitter 208 may include hardware, firmware, and/or software code executable by a processor for transmitting data, the code comprising instructions and being stored in a memory (e.g., computer-readable medium). A suitable example of transmitter 208 may including, but is not limited to, an RF transmitter.

Moreover, in an aspect, UE 104 may include RF front end 288, which may operate in communication with one or more antennas 265 and transceiver 202 for receiving and transmitting radio transmissions, for example, wireless communications transmitted by at least one base station 102 or wireless transmissions transmitted by UE 104. RF front end 288 may be connected to one or more antennas 265 and can include one or more low-noise amplifiers (LNAs) 290, one or more switches 292, one or more power amplifiers (PAs) 298, and one or more filters 296 for transmitting and receiving RF signals.

In an aspect, LNA 290 can amplify a received signal at a desired output level. In an aspect, each LNA 290 may have a specified minimum and maximum gain values. In an aspect, RF front end 288 may use one or more switches 292 to select a particular LNA 290 and its specified gain value based on a desired gain value for a particular application.

Further, for example, one or more PA(s) 298 may be used by RF front end 288 to amplify a signal for an RF output at a desired output power level. In an aspect, each PA 298 may have specified minimum and maximum gain values. In an aspect, RF front end 288 may use one or more switches 292 to select a particular PA 298 and its specified gain value based on a desired gain value for a particular application.

Also, for example, one or more filters 296 can be used by RF front end 288 to filter a received signal to obtain an input RF signal. Similarly, in an aspect, for example, a respective filter 296 can be used to filter an output from a respective PA 298 to produce an output signal for transmission. In an aspect, each filter 296 can be connected to a specific LNA 290 and/or PA 298. In an aspect, RF front end 288 can use one or more switches 292 to select a transmit or receive path using a specified filter 296, LNA 290, and/or PA 298, based on a configuration as specified by transceiver 202 and/or processor 212.

As such, transceiver 202 may be configured to transmit and receive wireless signals through one or more antennas 265 via RF front end 288. In an aspect, transceiver may be tuned to operate at specified frequencies such that UE 104 can communicate with, for example, one or more base stations 102 or one or more cells associated with one or more base stations 102. In an aspect, for example, modem 240 can configure transceiver 202 to operate at a specified frequency and power level based on the UE configuration of the UE 104 and the communication protocol used by modem 240.

In an aspect, modem 240 can be a multiband-multimode modem, which can process digital data and communicate with transceiver 202 such that the digital data is sent and received using transceiver 202. In an aspect, modem 240 can be multiband and be configured to support multiple frequency bands for a specific communications protocol. In an aspect, modem 240 can be multimode and be configured to support multiple operating networks and communications protocols. In an aspect, modem 240 can control one or more components of UE 104 (e.g., RF front end 288, transceiver 202) to enable transmission and/or reception of signals from the network based on a specified modem configuration. In an aspect, the modem configuration can be based on the mode of the modem and the frequency band in use. In another aspect, the modem configuration can be based on UE configuration information associated with UE 104 as provided by the network during cell selection and/or cell reselection.

In an aspect, RF front end 288 can include one or more components that are connected with one another and/or with antenna(s) 265 via a B2B connector. The one or more components can include multiple PCBs. The B2B connector may include receptacle on the PCBs and a plug on one or more ends of a FPC connecting the PCBs. The FPC can include multiple lines connected to the plug to facilitate communication between the PCBs via the multiple lines when the plug is coupled to the receptacle. For example, the multiple lines can be formed of a metallic material and can carry signals from multiple terminals of the PCB, including one or more IF terminals and/or control terminals, where the control terminals can include a battery terminal, a voltage terminal (e.g., 1.8 volts), a digital terminal, etc.

In an aspect, the processor(s) 212 may correspond to one or more of the processors described in connection with the UE in FIG. 10. Similarly, the memory 216 may correspond to the memory described in connection with the UE in FIG. 10.

FIGS. 3-7 illustrate examples of plug and receptacle combinations that can provide the EMI-compliant RF/IF connector that can support mmW communications (e.g., for 5G network devices). In each example, multiple chambers can be defined by a shielding material or structure and/or can be at least partially enclosed (e.g., surrounded or otherwise) by a continuous isolation structure (e.g., at least when the plug and receptacle are mated). At least partially enclosing can refer to either partially enclosing or fully enclosing, such that the multiple chambers can be defined by a shielding material or structure and/or can be partially enclosed or fully enclosed by a continuous isolation structure (e.g., at least when the plug and receptacle are mated). The continuous isolation structure can be formed of a metallic material able to provide a continuous ground structure when coupled to a ground reference. In addition, one or more terminals can be provided within each chamber to provide desired isolation between terminals and outside of the connector. The provided isolation can allow for to mitigation of RF leakage among the chambers and/or outside of the connector. In addition, for example, the entirety of the connected or at least all defined chambers, can be enclosed in the same or different continuous ground reference (e.g., on the plug and/or on the receptacle) to mitigate RF leakage outside of the connector.

Figure 3:
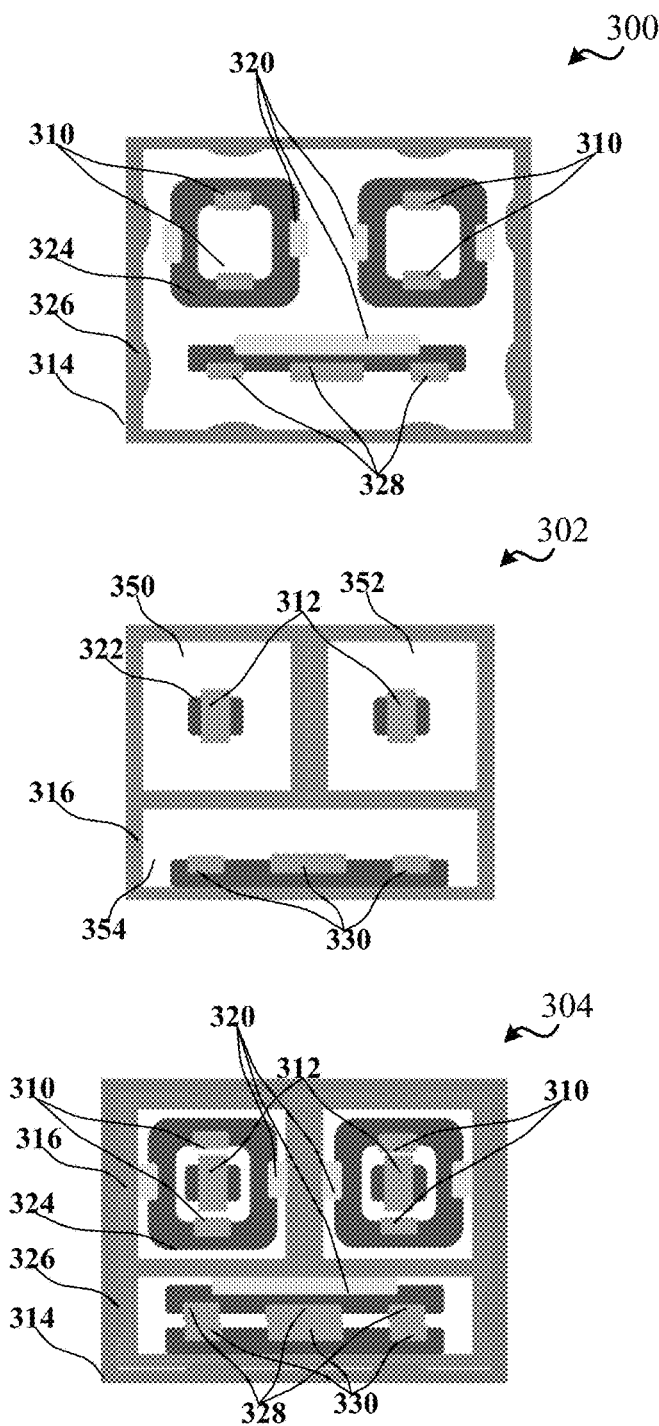
FIG. 3 is a block diagram illustrating an example of a receptacle and plug structure, in accordance with various aspects of the present disclosure.

Referring to FIG. 3, an example of a receptacle structure 300, corresponding example plug structure 302, and mated receptacle structure and plug structure to form a connector 304 are illustrated. For example, receptacle structure 300 can include IF signal tension pads 310 that can receive corresponding IF signal tension pads 312 of plug structure 302 when coupled thereto, where receiving the corresponding IF signal tension pads 312 can include physical contact with the pads 310, proximal non-contact positioning to facilitate transfer of energy (e.g., receiving energy therefrom), etc. For example, the IF signal tension pads 310, 312 can be composed of a metallic material or other material that facilitates conducting electricity to allow for activation/deactivation thereof for transmitting signals. In addition, the tension pads, in various examples described herein, may be formed in a structure and/or of a flexible material that provides a resisting force when one tension pad is mated with another tension pad in connecting a plug structure to a corresponding receptacle. For example, the resisting force may be provided by a spring or flexing action in the structure or material of the tension pads when mated (e.g., when a protruding tension pad is mated with one or more other protruding tension pads or mated into a recess formed by one or more other tension pads, as shown in various examples herein). Receptacle structure 300 can also include, for example, a metal ground 314 that can surround the various terminals (e.g., IF signal tension pads 310, 312 and peripheral signal tension pads 328) to shield RF leakage. In this specific example, the metal ground 314 can surround or define an outer perimeter of the receptacle structure 300 to prevent RF leakage outside of the connector. In addition, the plug structure 302 can have metal ground 316 as well that can contact the metal ground 314 of the receptacle structure 300 when coupled. The grounds can be made of a metallic material as well. In addition, at least metal ground 314 of the receptacle can include a connector to electrically couple with a ground source on the device.

The plug structures 302 can also include plastic supports 322 that can contact plastic supports 324 on the receptacle structure 300 to allow for guided insertion and/or mechanical coupling of the plug structure 302 to the receptacle structure 300. In addition, for example, the metal ground 314 on the receptacle structure 300 can include pressing feet 326 to hold the plug structure 302 in the receptacle structure 300 using mechanical force (and/or to ensure contact between metal ground 314 of the receptacle structure 300 and metal ground 316 of the plug structure 302 to form the continuous isolation structure therebetween). Receptacle structure 300, in an example, may also include peripheral signal tension pads 328 that can receive a corresponding peripheral signal tension pads 330 of plug structure 302 when coupled thereto.

As shown, for example, the metal ground 316 of the plug structure 302 can define chambers 350, 352, 354 that are shielded by a continuous ground structure (e.g., as the continuous isolation structure coupled to a ground reference), which can mitigate RF leakage outside of each of the chambers 350, 352, 354 and outside of the connector, as described. Chambers 350, 352, 354, in this example, can define an inner surface of metal ground 316 to provide the chamber. The signal tension pads 312, 330 are disposed within the inner surface. When connected to metal ground 314 of the receptacle, the chambers 350, 352, 354 can effectively isolate energy from the respectively surrounded signal tension pads 310, 312, 330. Signal tension pads 310, 312, 330 can also respectively provide terminals to facilitate electrical connection between the receptacle structure 300 and plug structure 302 (and can also be referred to herein as terminals). Specifically, in an example, the metal ground 316 of plug structure 302 can couple to the ground pads 320 of the receptacle structure 300, which can provide the continuous ground structure for the chambers 350, 352, 354. This can prevent the energy leaking into different chambers and/or out of the connector altogether (e.g., based additionally on the ground shielding the entirety of plug structure 302 and receptacle structure 300).

Figure 4:
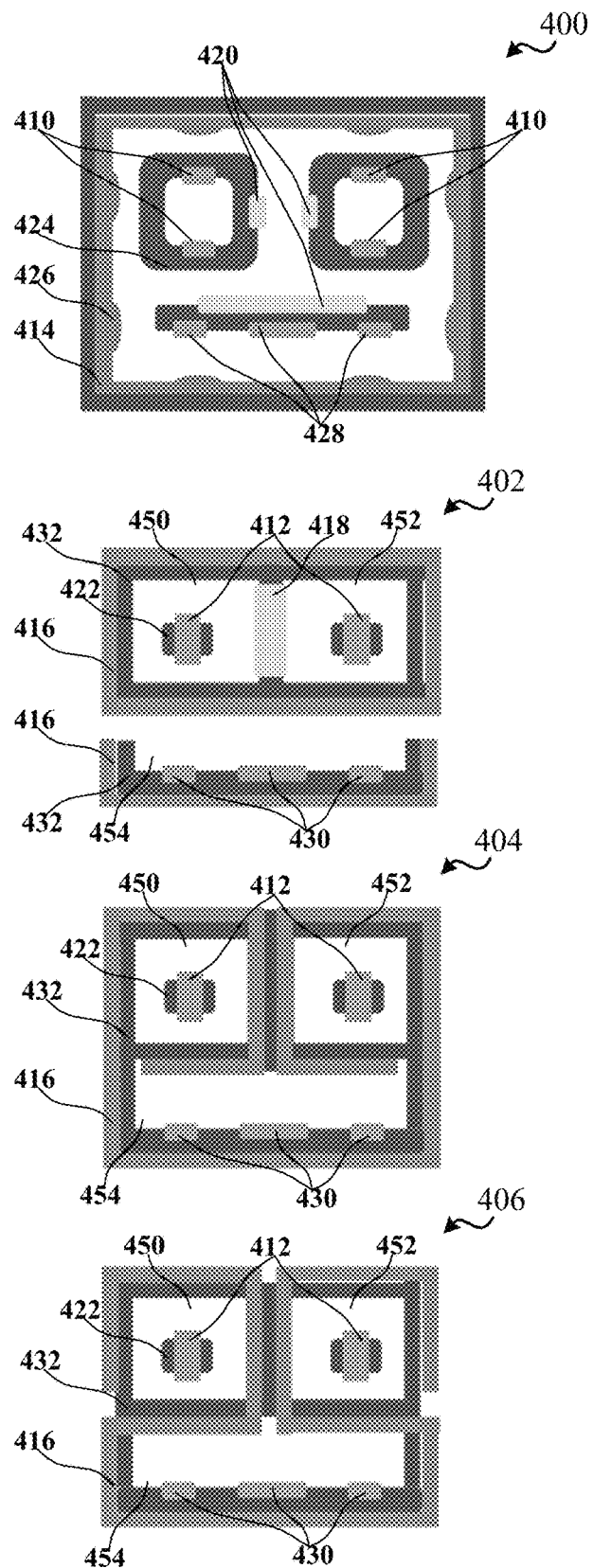
FIG. 4 is a block diagram illustrating an additional example of a receptacle and plug structure, in accordance with various aspects of the present disclosure.

Referring to FIG. 4, an example of another receptacle structure 400 and corresponding example plug structures 402, 404, 406 are illustrated. For example, receptacle structure 400 can include IF signal tension pads 410 that can receive corresponding IF signal tension pads 412 of one or more of the plug structures 402, 404, 406 when coupled thereto, as described. For example, the IF signal tension pads 410, 412 can be composed of a metallic material or other material that facilitates conducting electricity to allow for activation/deactivation thereof for transmitting signals. Receptacle structure 400 can also include, for example, a metal ground 414 that can surround the IF signal tension pads 410, 412 and peripheral signal tension pads 428 to shield RF leakage. In this specific example, the metal ground 414 can surround or define an outer perimeter of the receptacle structure 400 to prevent RF leakage outside of the connector. In addition, the plug structures 402, 404, 406 can have metal ground 416 as well that can contact the metal ground 414 of the receptacle structure 400 when coupled. Moreover, in one example, plug structure 402 can have a ground pad 418 that can couple with corresponding ground pads 420 of the receptacle structure 400. The various grounds can be made of a metallic material as well. In addition, at least metal ground 414 of the receptacle can include a connector to electrically couple with a ground source on the device.

The plug structures 402, 404, 406 can also include plastic supports 422 that can contact plastic supports 424 on the receptacle structure 400 to allow for guided insertion and/or mechanical coupling of the plug structure 402, 404, 406 to the receptacle structure 400. In addition, for example, the metal ground 414 on the receptacle structure 400 can include pressing feet 426 to hold the plug structure 402, 404, 406 in the receptacle structure 400 using mechanical force (and/or to ensure contact between metal ground 414 of the receptacle structure 400 and metal ground 416 of the plug structure 402, 404, 406 to form the continuous isolation structure therebetween). Receptacle structure 400, in an example, may also include peripheral signal tension pads 428 that can receive corresponding peripheral signal tension pads 430 of one or more of the plug structures 402, 404, 406 when coupled thereto.

As shown, for example, plastic support 432 can also be provided to at least partially define and/or isolate chamber 450, 452, 454. Chambers 450, 452, 454, in this example, can define an inner surface of metal ground 416 or plastic structure 432 to provide the chamber. The signal tension pads 412, 430 are disposed within the inner surface. In addition, the metal ground 416 of the plug structures 402, 404, 406 can at least partially surround chambers 450, 452, 454 and can provide a continuous isolation structure. When connected to metal ground 414 of the receptacle, a continuous ground structure of the chambers 450, 452, 454 can be effectuated for the connector, and can effectively isolate energy from the respectively surrounded signal tension pads 410, 412, 430 (also referred to herein as terminals). This can mitigate the energy leaking into different chambers and/or out of the connector altogether (e.g., based additionally on the ground shielding the entirety of plug structures 402, 404, 406 and receptacle structure 400).

For example, plug structure 402 can include the ground pad 418 that can provide the continuous ground structure for the chambers 450, 452, 454 when connected with ground pads 420 of receptacle structure 400, which can mitigate RF leakage outside of each of the chambers 450, 452, 454 and outside of the connector, as described. Pressing feet 426 can also effectuate the continuous ground structure by coupling the two metal grounds 416 of plug structure 402. In plug structure 404, the ground 416 surrounding the chambers 450, 452, 454 may remain partially open at a distal end based on the metal ground 416. This design, however, may allow for simplified manufacturing by providing a single ground line that can be shaped to form the chambers 450, 452, 454. In plug structure 406, the chambers 450, 452, 454 may remain partially open based on the metal ground 416, as well, but may be closed when contacting metal ground 414 (e.g., and/or corresponding pressing feet 426). In the designs of plug structures 404, 406, the metal ground 416 can provide the continuous ground structure for the chambers 450, 452, 454 when connected with ground pads 420 of receptacle structure 400, which can mitigate RF leakage outside of each of the chambers 450, 452, 454 and outside of the connector, as described.

Figure 5:
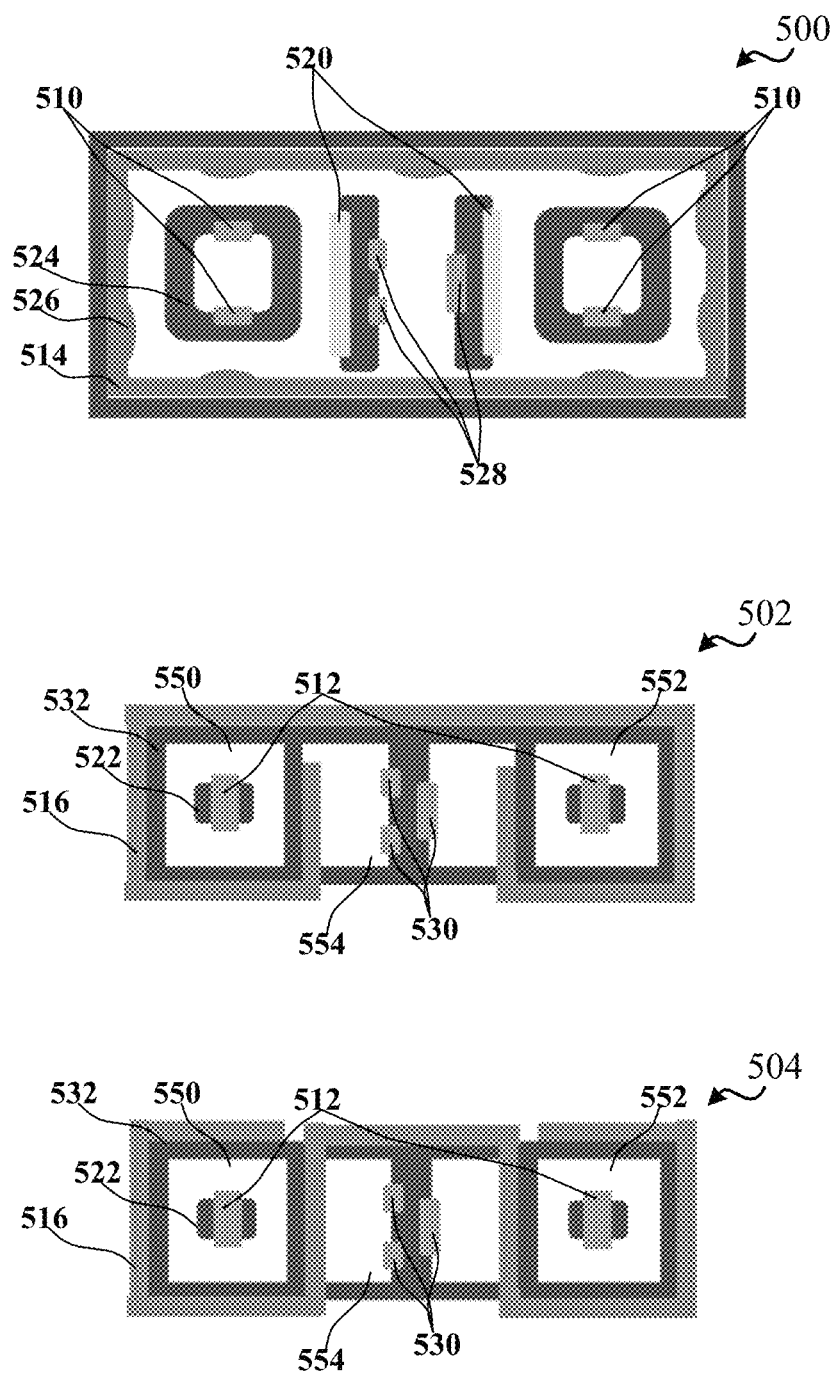
FIG. 5 is a block diagram illustrating another example of a receptacle and plug structure, in accordance with various aspects of the present disclosure.

Referring to FIG. 5, an example of another receptacle structure 500 and corresponding example plug structures 502, 504 are illustrated. For example, receptacle structure 500 can include IF signal tension pads 510 that can receive corresponding IF signal tension pads 512 of one or more of the plug structures 502, 504 when coupled thereto, as described. For example, the IF signal tension pads 510, 512 can be composed of a metallic material or other material that facilitates conducting electricity to allow for activation/deactivation thereof for transmitting signals. Receptacle structure 500 can also include, for example, a metal ground 514 that can surround the IF signal tension pads 510, 512 and peripheral signal tension pads 528 to shield RF leakage. In this specific example, the metal ground 514 can surround or define an outer perimeter of the receptacle structure 500 to prevent RF leakage outside of the connector. In addition, the plug structures 502, 504 can have metal ground 516 as well that can contact the metal ground 514 of the receptacle structure 500 when coupled. The various grounds can be made of a metallic material as well. In addition, at least metal ground 514 of the receptacle can include a connector to electrically couple with a ground source on the device.

The plug structures 502, 504 can also include plastic supports 522 that can contact plastic supports 524 on the receptacle structure 500 to allow for guided insertion and/or mechanical coupling of the plug structure 502, 504, 506 to the receptacle structure 500. In addition, for example, the metal ground 514 on the receptacle structure 500 can include pressing feet 526 to hold the plug structure 502, 504 in the receptacle structure 500 using mechanical force (and/or to ensure contact between metal ground 514 of the receptacle structure 500 and metal ground 516 of the plug structure 502, 504 to form the continuous isolation structure therebetween). Receptacle structure 500, in an example, may also include peripheral signal tension pads 528 that can receive corresponding peripheral signal tension pads 530 of one or more of the plug structures 502, 504 when coupled thereto.

As shown, for example, plastic support 532 can also be provided to at least partially define and/or isolate chamber 550, 552, 554. In addition, the metal ground 516 of the plug structures 502, 504 can at least partially surround chambers 550, 552, 554 and can provide a continuous isolation structure. When connected to metal ground 514 of the receptacle, a continuous ground structure of the chambers 550, 552, 554 can be effectuated for the connector, and can effectively isolate energy from the respectively surrounded signal tension pads 510, 512, 530 (also referred to herein as terminals). This can mitigate the energy leaking into different chambers and/or out of the connector altogether (e.g., based additionally on the ground shielding the entirety—e.g., an outer perimeter—of plug structures 502, 504 and receptacle structure 500).

In plug structure 502, the ground 516 surrounding the chambers 550, 552, 554 may remain partially open based on the metal ground 516. Chambers 550, 552, 554, in this example, can define an inner surface of metal ground 516 or plastic structure 524 to provide the chamber. The signal tension pads 512, 530 are disposed within the inner surface. This design, however, may allow for simplified manufacturing by providing a single ground line that can be shaped to form the chambers 550, 552, 554. In plug structure 504, the chambers 550, 552, 554 may remain partially open based on the metal ground 516, as well, but may be closed when contacting metal ground 514 (e.g., and/or corresponding pressing feet 526). In the designs of plug structures 504, 506, the metal ground 516 can provide the continuous ground structure for the chambers 550, 552, 554 when connected with ground pads 520 of receptacle structure 500, which can mitigate RF leakage outside of each of the chambers 550, 552, 554 and outside of the connector, as described.

Figure 6:
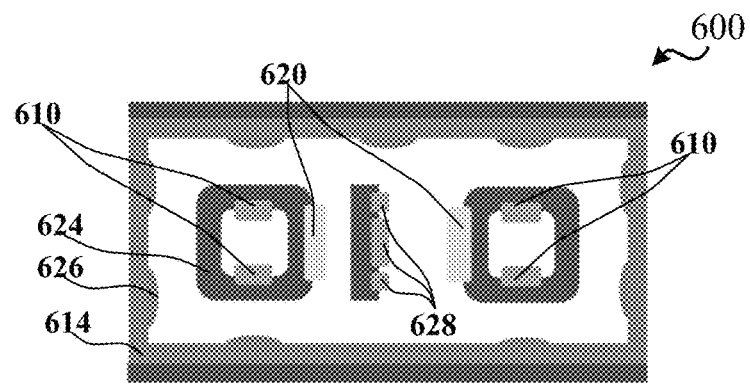
FIG. 6 is a block diagram illustrating another example of a receptacle and plug structure, in accordance with various aspects of the present disclosure.
Figure 6:
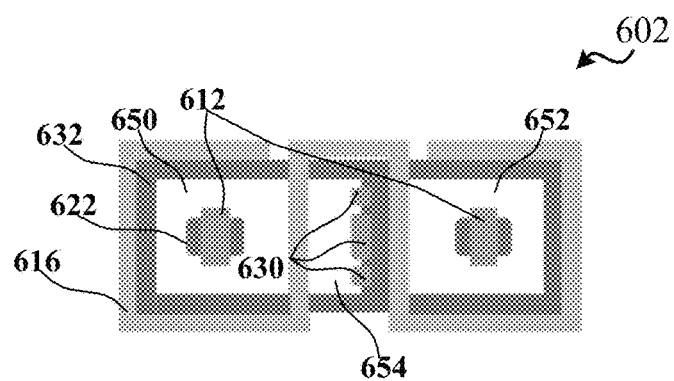
Figure 6:
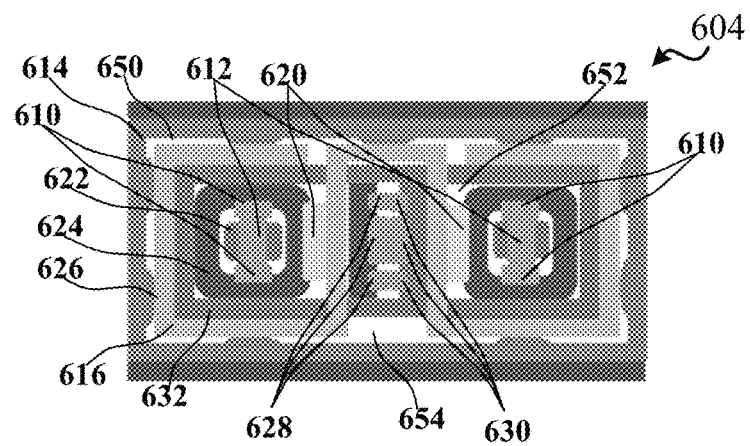

Referring to FIG. 6, an example of a receptacle structure 600, corresponding example plug structure 602, and mated receptacle structure and plug structure to form a connector 604 are illustrated. For example, receptacle structure 600 can include IF signal tension pads 610 that can receive corresponding IF signal tension pads 612 of plug structure 602 when coupled thereto, where receiving the corresponding IF signal tension pads 612 can include physical contact with the IF signal tension pads 610, proximal non-contact positioning to facilitate receiving energy therefrom, etc. For example, the IF signal tension pads 610, 612 can be composed of a metallic material or other material that facilitates conducting electricity to allow for activation/deactivation thereof for transmitting signals. Receptacle structure 600 can also include, for example, a metal ground 614 that can surround the various terminals (e.g., IF signal tension pads 610, 612 and peripheral signal tension pads 628) to shield RF leakage. In this specific example, the metal ground 614 can surround or define an outer perimeter of the receptacle structure 600 to prevent RF leakage outside of the connector. In addition, the plug structure 602 can have metal ground 616 as well that can contact the metal ground 614 of the receptacle structure 600 when coupled. The grounds can be made of a metallic material as well. In addition, at least metal ground 614 of the receptacle can include a connector to electrically couple with a ground source on the device.

The plug structure 602 can also include plastic supports 622 that can contact plastic supports 624 on the receptacle structure 600 to allow for guided insertion and/or mechanical coupling of the plug structure 602 to the receptacle structure 600. In addition, for example, the metal ground 614 on the receptacle structure 600 can include pressing feet 626 to hold the plug structure 602 in the receptacle structure 600 using mechanical force (and/or to ensure contact between metal ground 614 of the receptacle structure 600 and metal ground 616 of the plug structure 602 to form the continuous isolation structure therebetween). Receptacle structure 600, in an example, may also include peripheral signal tension pads 628 that can receive a corresponding peripheral signal tension pads 630 of plug structure 602 when coupled thereto.

As shown, for example, the metal ground 616 of the plug structure 602 can define chambers 650, 652, 654 that are shielded by a continuous ground structure that at least partially encloses the chambers 650, 652, 654. Plastic support 632 can also be provided to at least partially define and/or isolate chambers 650, 652, 654. Chambers 650, 652, 654, in this example, can define an inner surface of metal ground 616 and/or plastic structure 632 to provide the chamber. The plastic support 632 and/or 624 can also allow for guided junction of the signal tension pads 612, 630 to pads 610. The signal tension pads 612, 630 are disposed within the inner surface. When connected to metal ground 614 of the receptacle, the chambers 650, 652, 654 can effectively isolate energy from the respectively surrounded signal tension pads 610, 612, 630 (also referred to herein as terminals), mitigating RF leakage outside of each of the chambers 650, 652, 654 and outside of the connector, as described. As described, the single ground line 616 can simplify manufacturing process. In addition, this connector structure can prevent the energy leaking into different chambers and/or out of the connector altogether (e.g., based additionally on the ground shielding the entirety of plug structure 602 and receptacle structure 600).

Referring to FIG. 7, an example of a receptacle structure 700, corresponding example plug structure 702, and mated receptacle structure and plug structure to form a connector 704 are illustrated. For example, receptacle structure 700 can include IF signal tension pads 710 that can receive corresponding IF signal tension pads 712 of plug structure 702 when coupled thereto, where receiving the corresponding IF signal tension pads 712 can include physical contact with the pads 710, proximal non-contact positioning to facilitate receiving energy therefrom, etc. For example, the IF signal tension pads 710, 712 can be composed of a metallic material or other material that facilitates conducting electricity to allow for activation/deactivation thereof for transmitting signals. Receptacle structure 700 can also include, for example, a metal ground 714 that can surround the various terminals (e.g., IF signal tension pads 710, 712 and peripheral signal tension pads 728) to shield RF leakage from leaking outside of the receptacle structure 700.

Additionally, metal ground 714 can have a structure that forms separate chambers 750, 752 for the IF terminals and a chamber 754 for other terminals (e.g., corresponding to the peripheral signal tension pads 728) by forming IF isolated chamber walls 756, 758. This can provide isolation within the chambers to prevent interference across the chambers. In addition, the plug structure 702 can have metal ground 716 as well that can contact the metal ground 714 of the receptacle structure 700 when coupled. In an example, metal ground 716 can have a structure that forms separate chambers 751, 753 for the IF terminals and a chamber 755 for other terminals (e.g., corresponding to the peripheral signal tension pads 730) by forming IF isolated chamber walls 757, 759. The grounds can be made of a metallic material as well, and can be connected. In addition, at least metal ground 714 of the receptacle can include a connector to electrically couple with a ground source on the device.

The plug structure 702 can also include plastic supports 722 that can contact plastic supports 724 on the receptacle structure 700 to allow for guided insertion and/or mechanical coupling of the plug structure 702 to the receptacle structure 700. In addition, for example, the metal ground 714 on the receptacle structure 700 can include pressing feet 726 to hold the plug structure 702 in the receptacle structure 700 using mechanical force (and/or to ensure contact between metal ground 714 of the receptacle structure 700 and metal ground 716 of the plug structure 702). Receptacle structure 700, in an example, may also include peripheral signal tension pads 728 that can receive a corresponding peripheral signal tension pads 730 of plug structure 702 when coupled thereto.

As shown, for example, the metal ground 714 of the receptacle structure 700 can define chambers 750, 752, 754 and/or metal ground 716 of the plug structure 702 can define chambers 751, 753, 755. The metal ground 714 can form the continuous isolation structure for the chambers 750, 752, 754 on the receptacle structure 700, and the metal ground 716 can form the continuous isolation structure for chambers 751, 753, 755 on the plug structure 702. When the receptacle structure 700 and plug structure 702 are joined to create connector 704, the metal ground 714, which can be connected to a ground source on the device, can contact the metal ground 716, and chambers 751, 753, 755 can accordingly be completely shielded by ground, with the continuous isolation structure becoming grounded as a continuous ground structure. Plastic support 732 can also be provided to at least partially define and/or isolate chambers 751, 753, 755.

In an example, chambers 751, 753, 755 can define an inner surface (or one or more inner surfaces) of metal ground 716 (e.g., in conjunction with metal ground 714) and/or plastic structure 732 to provide the chamber. The plastic support 732 and/or 724 can also allow for guided junction of the IF signal tension pads 712 to IF signal tension pads 710. The IF signal tension pads 712 are disposed within the inner surfaces of their respective chambers 751, 753. When metal ground 716 is connected to metal ground 714 of the receptacle structure 700, the chambers 751, 753, 755 can effectively isolate energy from the respectively surrounded signal tension pads 712, 730 (also referred to herein as terminals). As described, the ground lines 714, 716 can be single ground lines to simplify manufacturing process. In addition, this connector structure can prevent the energy leaking into different chambers and/or out of the connector altogether (e.g., based additionally on the ground shielding the entirety of plug structure 702 and receptacle structure 700).

In addition, when the receptacle structure 700 is mated to the plug structure 702 to form connector 704, the tension pads 710, 712 can be in contact with one another to form IF terminals 770 and/or tension pads 728, 730 can be in contact with one another to form other terminals 772 (e.g., for peripheral signals, as described).

FIG. 8 illustrates an example of a FPC 800 that includes a plug structure 302 and a cable portion 802 attached thereto, and a FPC 804 that includes a plug structure 602 and a cable portion 806 attached thereto. As described, plug structure 302, 602 can include IF signal tension pads 312, 612 and peripheral signal tension pads 330, 630 for coupling to corresponding pads on a receptacle. In an example, the IF signal tension pads 312, 612 can be electrically coupled to IF lines 812 on the cable portion 802 and the peripheral signal tension pads 330, 630 can be electrically coupled to peripheral lines 830 on the cable portion 802. The FPC 800, 804 can include another plug structure at another end of the cable portion 802, 806 to facilitate connecting two or more PCBs via corresponding receptacles. In this example, the IF lines 812 can carry IF signals between IF signal tension pads 312, 612 on the plug structures, and peripheral lines 830 can carry control signals (e.g., battery signals, power signals, digital signals, etc.) between peripheral signal tension pads 330, 630 on the plug structures. The structure of the example plugs described above can allow for the simplified routing interface of the FPC 800, 804 on cable portion 802, 806. Though shown and described for plug structures 302, 602 of FIGS. 3 and 6, the FPC 800 can be used with substantially any of the plug structures that are disclosed and described herein (e.g., plug structures 402, 404, 406, 502, 504, 702) or otherwise conceivable based on the disclosures herein (e.g., any plug structure with continuous metal ground and/or chambers for terminals, as described herein).

FIG. 9 illustrates a flow chart of an example of a method 900 for manufacturing a printed circuit with at least a portion of an EMI-compliant RF connector described herein.

In method 900, at Block 902, at least a portion of a connector having multiple chambers and at least one terminal within each of the multiple chambers and each of the multiple chambers at least partially shielded by a continuous isolation structure can be formed. In an aspect, an apparatus used to generate a printed circuit, such as a PCB or FPC, can form at least the portion of the connector as described, where the portion of the connector can include a plug or receptacle portion described above. For example, when manufacturing a PCB, the portion of the connector may include a receptacle and when manufacturing a FPC, the portion of the connector may include a plug, and/or vice versa. For example, the manufactured receptacle and/or plug can include one of the examples described in FIGS. 3-7 or other receptacles/plugs that are formed to include multiple chambers that are shielded using plastic structures and/or a continuous ground reference, as described.

In method 900, at Block 904, at least one terminal in a first chamber of the multiple chambers can be coupled to a first line on a printed circuit for a first interface. In addition, in method 900, at Block 906, at least one terminal in a second chamber of the multiple chambers can be coupled to a second line on a printed circuit for a second interface. In one example, at least one of the first and second interface can correspond to an IF interface. For example, this can include connecting IF signal tension pads 312, 612 to IF lines 812 shown in FIG. 8.

In method 900, at Block 908, at least one terminal in a third chamber of the multiple chambers can be coupled to a third line on a printed circuit. In an example, the third line can include a peripheral line for control signals that are peripheral to the IF signals. For example, this can include connecting peripheral signal tension pads 330, 630 to peripheral lines 830 shown in FIG. 8.

Figure 10:
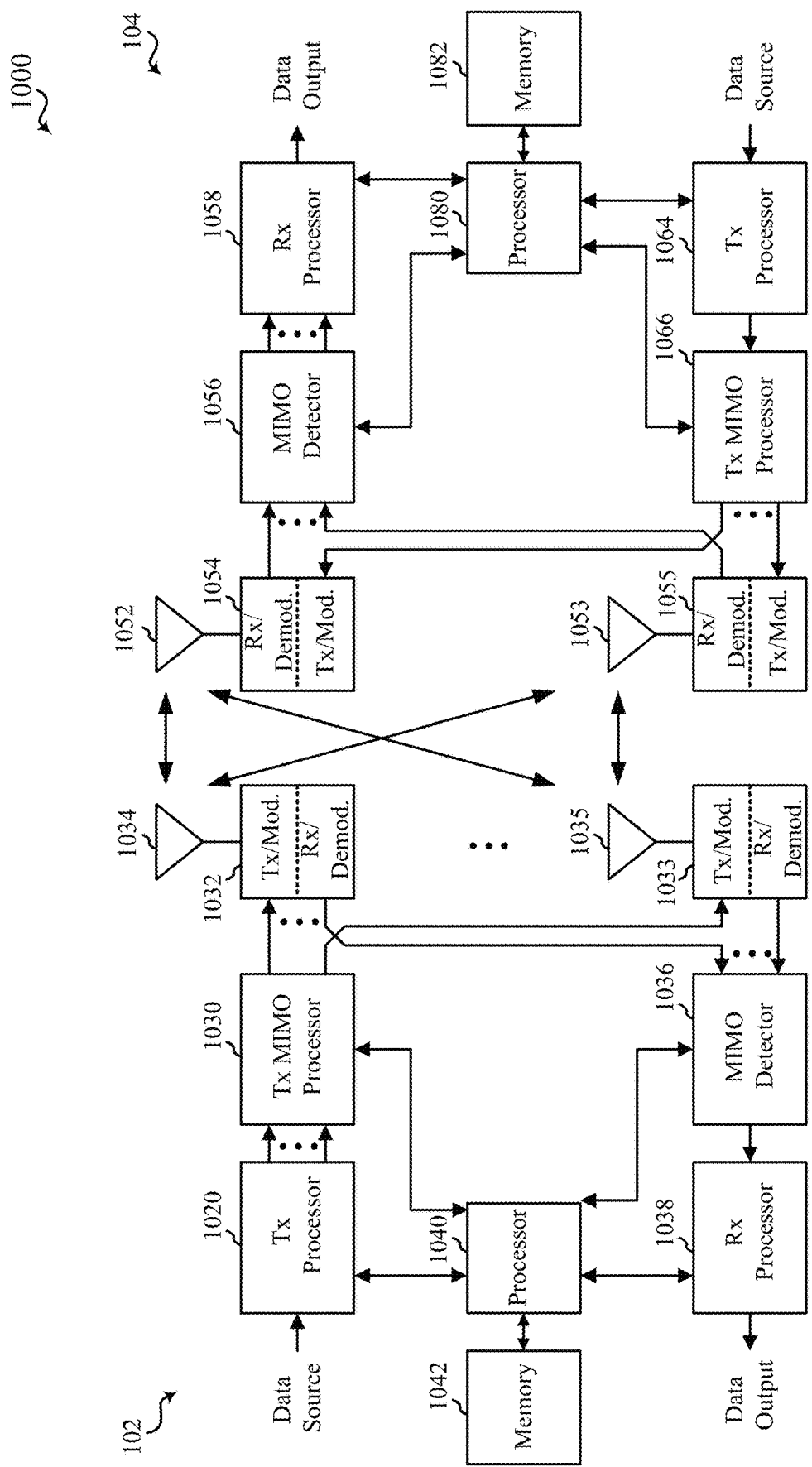
FIG. 10 is a block diagram illustrating an example of a MIMO communication system including a base station and a UE, in accordance with various aspects of the present disclosure.

FIG. 10 is a block diagram of a MIMO communication system 1000 including a base station 102 and a UE 104. The MIMO communication system 1000 may illustrate aspects of the wireless communication access network 100 described with reference to FIG. 1. The base station 102 may be an example of aspects of the base station 102 described with reference to FIG. 1. The base station 102 may be equipped with antennas 1034 and 1035, and the UE 104 may be equipped with antennas 1052 and 1053. In the MIMO communication system 1000, the base station 102 may be able to send data over multiple communication links at the same time. Each communication link may be called a "layer" and the "rank" of the communication link may indicate the number of layers used for communication. For example, in a 2×2 MIMO communication system where base station 102 transmits two "layers," the rank of the communication link between the base station 102 and the UE 104 is two.

At the base station 102, a transmit (Tx) processor 1020 may receive data from a data source. The transmit processor 1020 may process the data. The transmit processor 1020 may also generate control symbols or reference symbols. A transmit MIMO processor 1030 may perform spatial processing (e.g., precoding) on data symbols, control symbols, or reference symbols, if applicable, and may provide output symbol streams to the transmit modulator/demodulators 1032 and 1033. Each modulator/demodulator 1032 through 1033 may process a respective output symbol stream (e.g., for OFDM, etc.) to obtain an output sample stream. Each modulator/demodulator 1032 through 1033 may further process (e.g., convert to analog, amplify, filter, and upconvert) the output sample stream to obtain a DL signal. In one example, DL signals from modulator/demodulators 1032 and 1033 may be transmitted via the antennas 1034 and 1035, respectively.

The UE 104 may be an example of aspects of the UEs 104 described with reference to FIGS. 1-2. At the UE 104, the UE antennas 1052 and 1053 may receive the DL signals from the base station 102 and may provide the received signals to the modulator/demodulators 1054 and 1055, respectively. Each modulator/demodulator 1054 through 1055 may condition (e.g., filter, amplify, downconvert, and digitize) a respective received signal to obtain input samples. Each modulator/demodulator 1054 through 1055 may further process the input samples (e.g., for OFDM, etc.) to obtain received symbols. A MIMO detector 1056 may obtain received symbols from the modulator/demodulators 1054 and 1055, perform MIMO detection on the received symbols, if applicable, and provide detected symbols. A receive (Rx) processor 1058 may process (e.g., demodulate, deinterleave, and decode) the detected symbols, providing decoded data for the UE 104 to a data output, and provide decoded control information to a processor 1080, or memory 1082.

On the uplink (UL), at the UE 104, a transmit processor 1064 may receive and process data from a data source. The transmit processor 1064 may also generate reference symbols for a reference signal. The symbols from the transmit processor 1064 may be precoded by a transmit MIMO processor 1066 if applicable, further processed by the modulator/demodulators 1054 and 1055 (e.g., for SC-FDMA, etc.), and be transmitted to the base station 102 in accordance with the communication parameters received from the base station 102. At the base station 102, the UL signals from the UE 104 may be received by the antennas 1034 and 1035, processed by the modulator/demodulators 1032 and 1033, detected by a MIMO detector 1036 if applicable, and further processed by a receive processor 1038. The receive processor 1038 may provide decoded data to a data output and to the processor 1040 or memory 1042.

The components of the UE 104 may, individually or collectively, be implemented with one or more ASICs adapted to perform some or all of the applicable functions in hardware. Each of the noted modules may be a means for performing one or more functions related to operation of the MIMO communication system 1000. Similarly, the components of the base station 102 may, individually or collectively, be implemented with one or more ASICs adapted to perform some or all of the applicable functions in hardware. Each of the noted components may be a means for performing one or more functions related to operation of the MIMO communication system 1000.

In an example, various components of the UE 104 may be coupled using the EMI-compliant RF connector described herein, such as antennas 1052, 1053 to modulator/demodulators 1054 and 1055, respectively.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Thus, the disclosure is not to be limited to the examples and designs described herein but is to be accorded the widest scope consistent with the principles and novel features disclosed herein.

The following provides an overview of further clauses of the present invention:

1. A plug configured to support wireless communications, comprising:

multiple chambers, wherein each chamber of the multiple chambers is at least partially enclosed by a continuous isolation structure and defines an inner surface; and at least one terminal within the inner surface of each of the multiple chambers, wherein at least a first terminal in a first chamber of the multiple chambers is configured for a first interface, and wherein at least a second terminal in a second chamber of the multiple chambers is configured for a second interface.

2. The plug of clause 1, wherein the plug is used for flexible printed circuit (FPC) and is configured to support millimeter wave (mmW) wireless communications.

3. The plug of any of clauses 1 or 2, wherein the continuous isolation structure is a continuous ground structure.

4. The plug of any of clauses 1 to 3, wherein the first interface includes a first intermediate frequency (IF) interface and wherein the second interface includes a second IF interface.

5. The plug of clause 4, wherein at least a third terminal in a third chamber of the multiple chambers includes one or more control terminals.

6. The plug of clause 5, wherein the one or more control terminals include at least one of a battery terminal, a voltage terminal, or a digital terminal.

7. The plug of any of clauses 4 to 6, wherein the first IF interface and the second IF interface are configured to carry millimeter wave signals.

8. The plug of any of clauses 1 to 7, wherein one or more of the multiple chambers have an opening in the continuous isolation structure.

9. The plug of clause 8, wherein the one or more of the multiple chambers form a closed continuous ground structure when the plug is coupled to a receptacle.

10. The plug of any of clauses 1 to 9, wherein at least the first terminal includes a tension pad for electrically coupling with a corresponding tension pad on a receptacle for facilitating electrical contact with the corresponding tension pad.

11. The plug of clause 10, wherein the electrically coupling includes physical contact or proximal non-contact positioning between the tension pad and the corresponding tension pad on the receptacle to facilitate transfer of energy.

12. The plug of any of clauses 1 to 11, wherein the continuous isolation structure is a continuous ground structure formed of a single ground line wrapped to form each chamber of the multiple chambers.

13. A method for manufacturing a printed circuit configured to support wireless communications, comprising:
  forming at least a portion of a connector having multiple chambers and at least one terminal within each of the multiple chambers, wherein each chamber is at least partially enclosed by a continuous isolation structure;
  coupling at least a first terminal in a first chamber of the multiple chambers to a first line on the printed circuit for a first interface; and
  coupling at least at least a second in a second chamber of the multiple chambers to a second line on the printed circuit for a second interface.

14. The method of clause 13, further comprising coupling at least a third terminal in a third chamber of the multiple chambers to at least a third line on the printed circuit, wherein at least the third terminal in the third chamber includes one or more control terminals.

15. The method of clause 14, wherein the one or more control terminals include at least one of a battery terminal, a voltage terminal, or a digital terminal.

16. The method of any of clauses 13 to 15, wherein forming at least the portion of the connector comprises forming at least the first terminal as a tension pad for coupling with a corresponding tension pad on a receptacle for facilitating electrically coupling with the corresponding tension pad.

17. The method of any of clauses 13 to 16, wherein forming at least the portion of the connector comprises forming the continuous isolation structure using a single ground line wrapped to form each of the multiple chambers.

18. The method of any of clauses 13 to 17, wherein at least the portion of the connector is a plug or a receptacle.

19. A receptacle configured to support wireless communications, comprising:
  at least two terminals configured for a first interface and a second interface; and
  an isolation portion at least partially enclosing each of the at least two terminals in respective chambers, wherein the isolation portion forms part of a continuous isolation structure, at least when coupled with a plug having at least two different terminals that couple to the at least two terminals.

20. The receptacle of clause 19, wherein the receptacle is used for coupling to a printed circuit board and is configured to support millimeter wave (mmW) wireless communications.

21. The receptacle of any of clauses 19 or 20, wherein the first interface includes a first intermediate frequency (IF) interface and the second interface includes a second IF interface.

22. The receptacle of any of clauses 19 to 21, wherein the isolation portion is metal ground portion and the continuous isolation structure is a continuous ground structure.

23. The receptacle of any of clauses 19 to 22, further comprising one or more control terminals, and wherein the isolation portion at least partially encloses the one or more control terminals in another chamber.

24. The receptacle of clause 23, wherein the one or more control terminals include at least one of a battery terminal, a voltage terminal, or a digital terminal.

25. The receptacle of any of clauses 19 to 24, wherein the isolation portion comprises pressing feet to mechanically hold the plug in the receptacle.

26. The receptacle of any of clauses 19 to 25, further comprising a connector to couple the isolation portion to a ground source of a device to provide a continuous ground structure.

What is claimed is:

1. A plug configured to support wireless communications, comprising:
  multiple chambers, wherein each chamber of the multiple chambers is at least partially enclosed by a continuous isolation structure and defines an inner surface; and
  at least one terminal within the inner surface of each of the multiple chambers, wherein at least a first terminal in a first chamber of the multiple chambers is configured for a first interface, and wherein at least a second terminal in a second chamber of the multiple chambers is configured for a second interface,
  wherein the continuous isolation structure of each of the multiple chambers forms a continuous ground structure completely surrounding the chamber, wherein the continuous ground structure is configured to be grounded by contact, via mechanical force, with pressing feet of a metal ground portion of a receptacle.

2. The plug of claim 1, wherein the plug is used for flexible printed circuit (FPC) and is configured to support millimeter wave (mmW) wireless communications.

3. The plug of claim 1, wherein the continuous isolation structure is a continuous ground structure formed of a single ground line wrapped to form each chamber of the multiple chambers.

4. The plug of claim 1, wherein the first interface includes a first intermediate frequency (IF) interface and wherein the second interface includes a second IF interface.

5. The plug of claim 4, wherein at least a third terminal in a third chamber of the multiple chambers includes one or more control terminals.

6. The plug of claim 5, wherein the one or more control terminals include at least one of a battery terminal, a voltage terminal, or a digital terminal.

7. The plug of claim 4, wherein the first IF interface and the second IF interface are configured to carry millimeter wave signals.

8. The plug of claim 1, wherein one or more of the multiple chambers have an opening in the continuous isolation structure.

9. The plug of claim 8, wherein the one or more of the multiple chambers form a closed continuous ground structure when the plug is coupled to a receptacle.

10. The plug of claim 1, wherein at least the first terminal includes a tension pad for electrically coupling with a corresponding tension pad on a receptacle for facilitating electrical contact with the corresponding tension pad.

11. The plug of claim 10, wherein the electrically coupling includes physical contact or proximal non-contact positioning between the tension pad and the corresponding tension pad on the receptacle to facilitate transfer of energy.

12. A method for manufacturing a printed circuit configured to support wireless communications, comprising:
    forming at least a portion of a connector having multiple chambers and at least one terminal within each of the multiple chambers, wherein each chamber is at least partially enclosed by a continuous isolation structure;
    coupling at least a first terminal in a first chamber of the multiple chambers to a first line on the printed circuit for a first interface; and
    coupling at least a second terminal in a second chamber of the multiple chambers to a second line on the printed circuit for a second interface,
    wherein the continuous isolation structure of each of the multiple chambers forms a continuous ground structure completely surrounding the chamber, wherein the continuous ground structure is configured to be grounded by contact, via mechanical force, with pressing feet of a metal ground portion of a receptacle.

13. The method of claim 12, wherein at least the portion of the connector is a plug or a receptacle.

14. The method of claim 12, further comprising coupling at least a third terminal in a third chamber of the multiple chambers to at least a third line on the printed circuit, wherein at least the third terminal in the third chamber includes one or more control terminals.

15. The method of claim 14, wherein the one or more control terminals include at least one of a battery terminal, a voltage terminal, or a digital terminal.

16. The method of claim 12, wherein forming at least the portion of the connector comprises forming at least the first terminal as a tension pad for coupling with a corresponding tension pad on a receptacle for facilitating electrically coupling with the corresponding tension pad.

17. The method of claim 12, wherein forming at least the portion of the connector comprises forming the continuous isolation structure using a single ground line wrapped to form each of the multiple chambers.

18. A receptacle configured to support wireless communications, comprising:
    at least two terminals configured for a first interface and a second interface; and
    an isolation portion at least partially enclosing each of the at least two terminals in respective chambers, wherein the isolation portion forms part of a continuous isolation structure, at least when coupled with a plug having at least two different terminals that couple to the at least two terminals,
    wherein the isolation portion of each of the respective chambers is a metal ground portion having pressing feet configured for contacting a plug using mechanical force and providing a continuous ground structure for the respective chambers.

19. The receptacle of claim 18, further comprising a connector to couple the isolation portion to a ground source of a device to provide a continuous ground structure.

20. The receptacle of claim 18, wherein the receptacle is used for coupling to a printed circuit board and is configured to support millimeter wave (mmW) wireless communications.

21. The receptacle of claim 18, wherein the first interface includes a first intermediate frequency (IF) interface and the second interface includes a second IF interface.

22. The receptacle of claim 18, wherein the isolation portion comprises pressing feet to mechanically hold the plug in the receptacle.

23. The receptacle of claim 18, further comprising one or more control terminals, and wherein the isolation portion at least partially encloses the one or more control terminals in another chamber.

24. The receptacle of claim 23, wherein the one or more control terminals include at least one of a battery terminal, a voltage terminal, or a digital terminal.

\* \* \* \* \*